United States Patent [19]
Yamada et al.

[11] Patent Number: 5,971,191
[45] Date of Patent: *Oct. 26, 1999

[54] GASKET FOR USE IN A CONTAINER

[75] Inventors: Naoki Yamada; Mitsuo Terada, both of Miyazaki; Kiyoshi Nishizawa, Osaka; Jun Uchida, Tokyo, all of Japan

[73] Assignees: Komatsu Electronic Metals Co., Ltd.; Komatsu Plastics Industrial Co., Ltd.

[*] Notice: This patent issued on a continued prosecution application filed under 37 CFR 1.53(d), and is subject to the twenty year patent term provisions of 35 U.S.C. 154(a)(2).

[21] Appl. No.: 08/800,486

[22] Filed: Feb. 14, 1997

Related U.S. Application Data

[62] Division of application No. 08/535,036, filed as application No. PCT/JP94/00236, Feb. 16, 1994, abandoned.

[30] Foreign Application Priority Data

Apr. 27, 1993 [JP] Japan ..................................... 5-136392
Jul. 28, 1993 [JP] Japan ..................................... 5-227755

[51] Int. Cl.[6] .................................................. B65D 53/02
[52] U.S. Cl. .......................... 220/378; 206/710; 220/797; 220/806; 277/648
[58] Field of Search .................................... 220/378, 304, 220/797, 310.1, 344, 803, 804, 806; 277/590, 604, 615, 626, 644, 648, 649, 639, 641, 642; 206/710, 711, 712

[56] References Cited

U.S. PATENT DOCUMENTS

| | | | |
|---|---|---|---|
| 2,383,089 | 8/1945 | Theiler | 220/378 X |
| 2,396,491 | 3/1946 | Chamberlain | 220/378 |
| 2,501,943 | 3/1950 | Jack | 277/615 X |
| 2,666,548 | 1/1954 | Lund | 220/378 X |
| 2,857,075 | 10/1958 | Shazor, Jr. | 220/378 |
| 2,937,065 | 5/1960 | Harza | 277/649 X |
| 3,134,612 | 5/1964 | Glasgow | 277/615 X |
| 3,217,921 | 11/1965 | Frehse | 220/378 |
| 3,294,409 | 12/1966 | Burtis | 220/378 X |
| 3,334,774 | 8/1967 | Poltorak | 220/378 |
| 3,355,057 | 11/1967 | MacKenzie et al. | 220/378 |
| 3,701,452 | 10/1972 | Tonn | 220/378 |
| 4,088,302 | 5/1978 | Williams | 277/649 X |
| 4,699,293 | 10/1987 | Duchrow | 277/641 X |
| 4,834,037 | 5/1989 | Lafever | 277/502 X |
| 4,854,476 | 8/1989 | Serio, Jr. | 220/378 X |
| 5,058,906 | 10/1991 | Adamek et al. | 277/649 X |

*Primary Examiner*—Stephen P. Garbe
*Assistant Examiner*—Niki M. Eloshway
*Attorney, Agent, or Firm*—Sheridan Ross P. C.

[57] ABSTRACT

A container for packing semiconductor wafer is provided which has superior airtightness to prevent contamination of the wafers by air. A gasket groove is formed on the case of the container. A gasket is inserted within the gasket groove. The gasket contains protrusions that assist in providing an airtight seal. The case and a lid are securely fastened together by the engagement of four clips within respective clip recesses that are formed in the container and lid.

10 Claims, 16 Drawing Sheets

GASKET FOR USE IN A CONTAINER

This is a divisional of application Ser. No. 08/535,036 which is a 371 of PCT/JP94/00236 and, having an international filing date of Feb. 16, 1994, and a U.S. national phase filing date of Dec. 28, 1995, now abandoned.

FIELD OF THE INVENTION

This invention relates to a container for packing semiconductor wafers to ensure safekeeping and to prevent damage or contamination of the wafers during transport.

BACKGROUND OF THE INVENTION

One prior art container used for packing semiconductor wafers is disclosed in JP. A 3-114245. The container generally consists of a wafer carrier which can hold a plurality of wafers therein. The wafer carrier is housed within a case. The container also includes a lid and a wafer pressing part.

The wafer carrier generally includes a plurality of holding grooves which have lower portions that are inwardly curved to receive the plurality of wafers. The case typically has a protruding edge or groove along its top portion to engage a lid which allows for closing of the case. Two latches are disposed at sides of the top portion against one another and with recesses in the lid to secure the lid with the case.

However, the airtightness of the above described structure is not sufficient to prevent air contamination of the wafers. In this regard, the lid typically does not perfectly attach to the top portion of the case, and the lid is not firmly fastened using two latches.

Accordingly, it is an object of the present invention to provide a container for packing semiconductor wafer which has superior airtightness and which can prevent contamination of the semiconductor wafers by air.

SUMMARY OF THE INVENTION

To accomplish the foregoing objects, a container for packing semiconductor wafers is provided in the present invention. The container includes a wafer carrier having a plurality of holding grooves on opposing inner walls to individually receive the wafers therein. A wafer support is provided which is disposed above the wafer carrier to press and hold the wafers.

In one aspect, a rectangular box-shaped case is provided having an open top to contain the wafer carrier and the wafer support. A lid is provided that is fitted on the case to form an airtight seal.

In another aspect, the wafer support includes a base plate and a plurality of supporting spring rows which pectinately protrude against each wafer at both edges of the base plate. The plurality of supporting spring rows are removable affixed to the lid.

The case includes four sidewalls, and a sash having plane surfaces and perpendicular corners. The sash is integral with the sidewalls. The case also includes handles formed in the sidewalls and dented portions formed under the handles. A seal groove is formed on the top of the sash for housing a gasket. Clip recesses are respectively formed in the middle of plane surfaces of the sash for engaging with clips. A bottom plate is provided at bottom ends of the four sidewalls. An arrow is drawn on the bottom plate. Square dents are inwardly depressed into the bottom plate to assist in stacking of the containers.

The lid includes four sidewalls. Eaves unite and horizontally protrude from said sidewalls. A sash is provided having plane surfaces and perpendicular corners. Clip recesses are respectively formed in the middle of the plane surfaces for engaging with clips. Engaging holes are provided that engage with top end protrusions of the clips. The clips removably engage with the lid. A ceiling portion is provided on the top end of the sidewalls. Protruding corners are formed on the ceiling portion to assist in stacking of the containers. Engaging grooves are provided on the inner surface of the ceiling portion to removably engage with the base plate of the wafer support such that semiconductor wafers are contained in the wafer carrier and held between the parts of the case and the lid.

DETAILED DESCRIPTION

The present invention will be described in relation to the accompanying drawings which assists in illustrating the pertinent features thereof.

Figure 1:
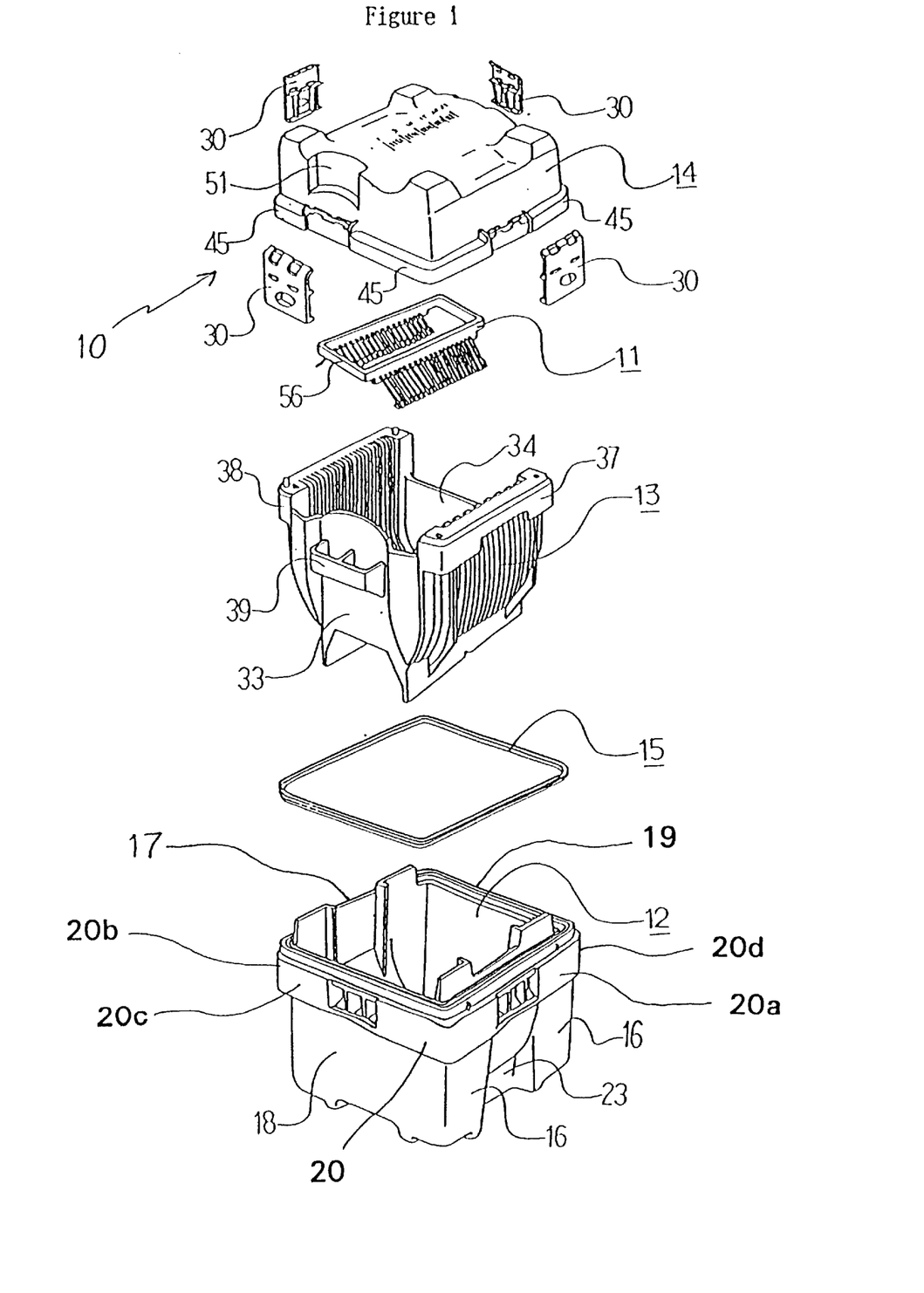
FIG. 1 is an exploded perspective view of a container of the present invention used for packing semiconductor wafers.
Figure 2:
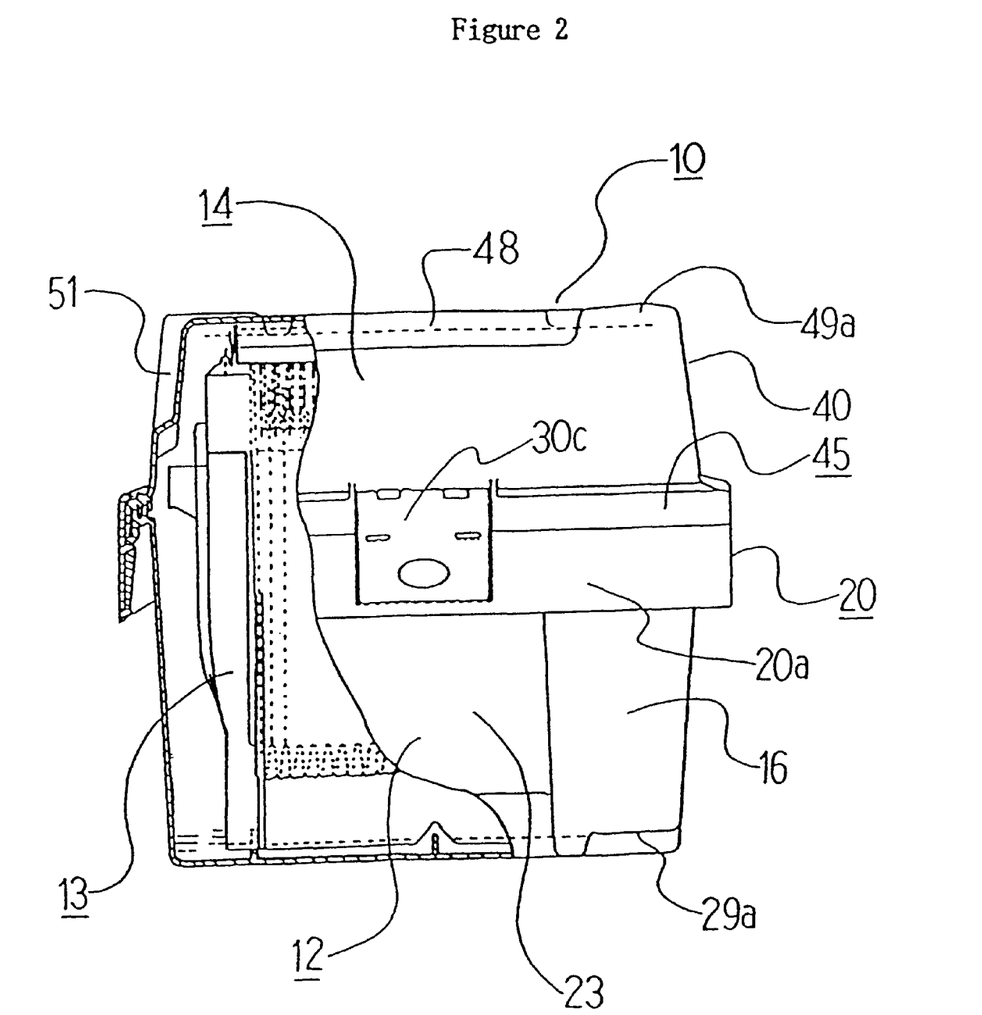
FIG. 2 is an elevated view partly in section of a container with a wafer carrier containing wafers.
Figure 3:
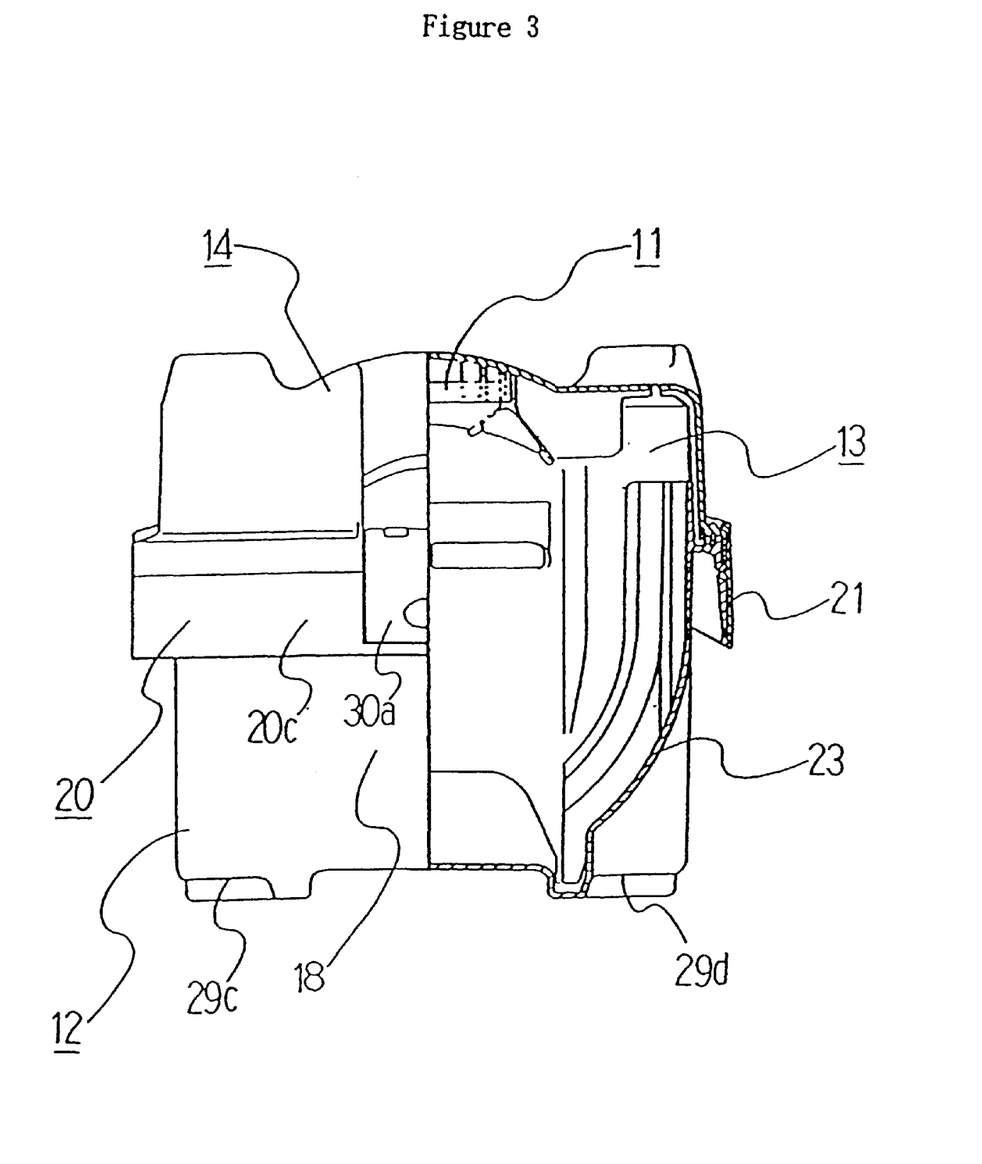
FIG. 3 is an opposite side view of FIG. 2.

As shown in FIG. 2, the container 10 of the present invention is used to safely house and transport semiconductor wafers held in a wafer carrier 13. The container 10, as shown in FIG. 1, includes a case 12 and a lid 14. The lid 14 covers the open top of the case 10. As shown in FIG. 2 and FIG. 3, the case 12 houses the wafer carrier 13 therein.

The case 12 includes sidewalls 16, 17, 18, 19, a sash 20, handles 21, 22 and a dented portion 23, 24. The sash 20 includes plane surfaces 20*a*, 20*b*, 20*c* and 20*d*. Both side ends of each plane surfaces are joined and respectively form rounded perpendicular corners. The plane surfaces 20*a*, 20*b*, 20*c* and 20*d* are respectively connected with the sidewalls 16, 17, 18 and 19. The sidewall 16 has a dented portion 23 under the handle 21, and the sidewall 17 which is in an opposite position relative to sidewall 16 has a dented portion 24 under the handle 22.

Figure 4:
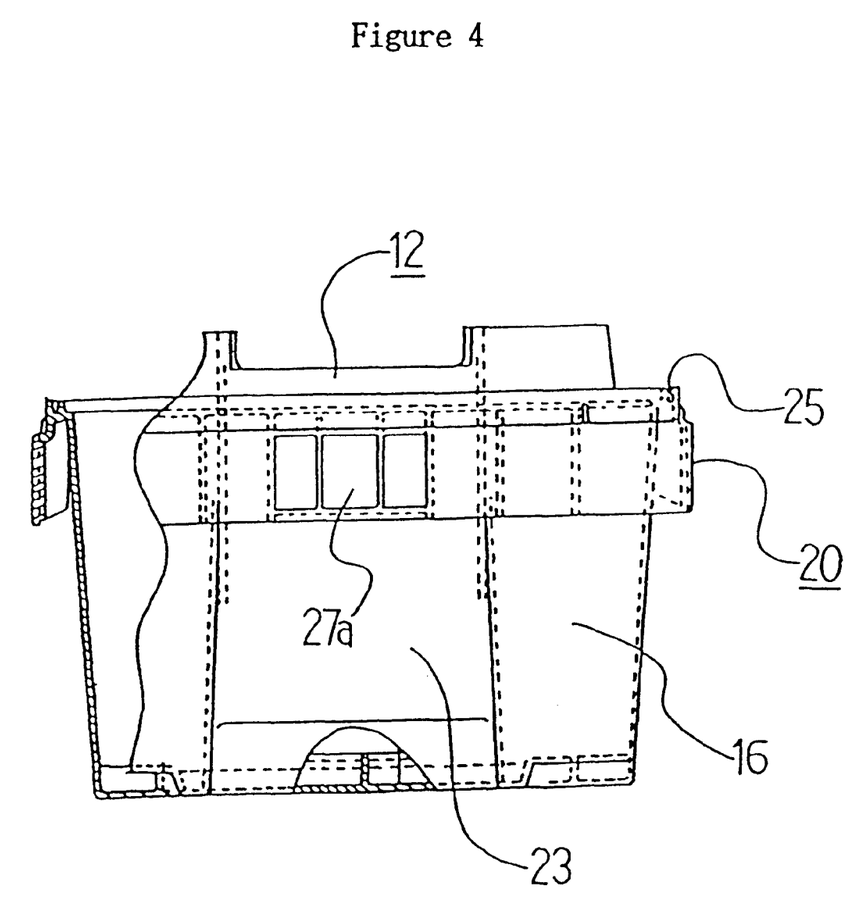
FIG. 4 is an elevated view partly in section of a case.
Figure 5:
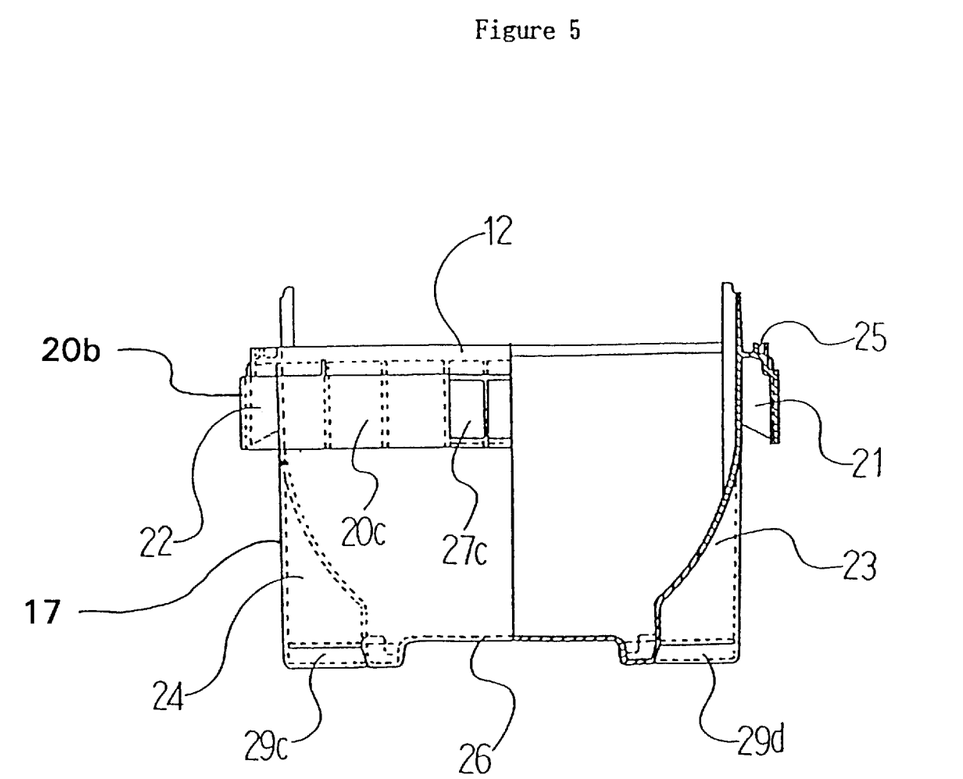
FIG. 5 is an opposite side view of FIG. 4.

As shown in FIG. 4 and FIG. 5, a U-shaped seal groove 25 is formed on the top ends of the plane surfaces 20*a*, 20*b*, 20*c* and 20*d*. A gasket 15 is positioned into the seal groove 25.

As shown in FIG. 4 and FIG. 5, clip recesses 27a, 27b, 27c and 27d are formed to engage with four clips 30 of the lid 14 at the middle of each of the plane surfaces 20a, 20b, 20c and 20d.

Figure 6:
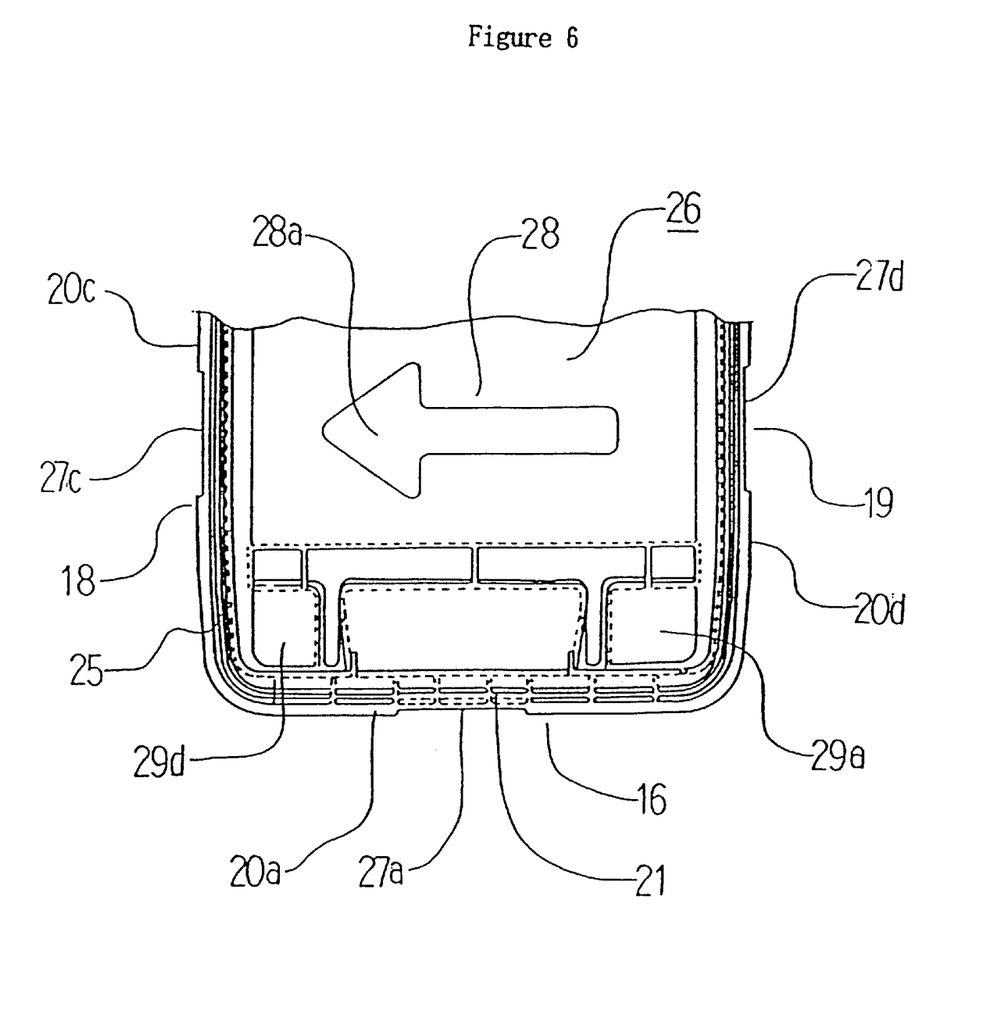
FIG. 6 is a top view of a case.

As shown in FIG. 6, a bottom plate 26 of the case 12 is joined with each of the bottom ends of the sidewalls 16, 17, 18 and 19. An arrow 28a is drawn on the center 28 of the bottom plate 26. The arrow 28a indicates the direction that the mirror side of a wafer should be positioned and the direction for the insertion of the wafer carrier 13. The bottom plate 26 has square dents 29a, 29b, 29c and 29d depressed toward the inside of the case 12 on each corner thereof.

Figure 7:
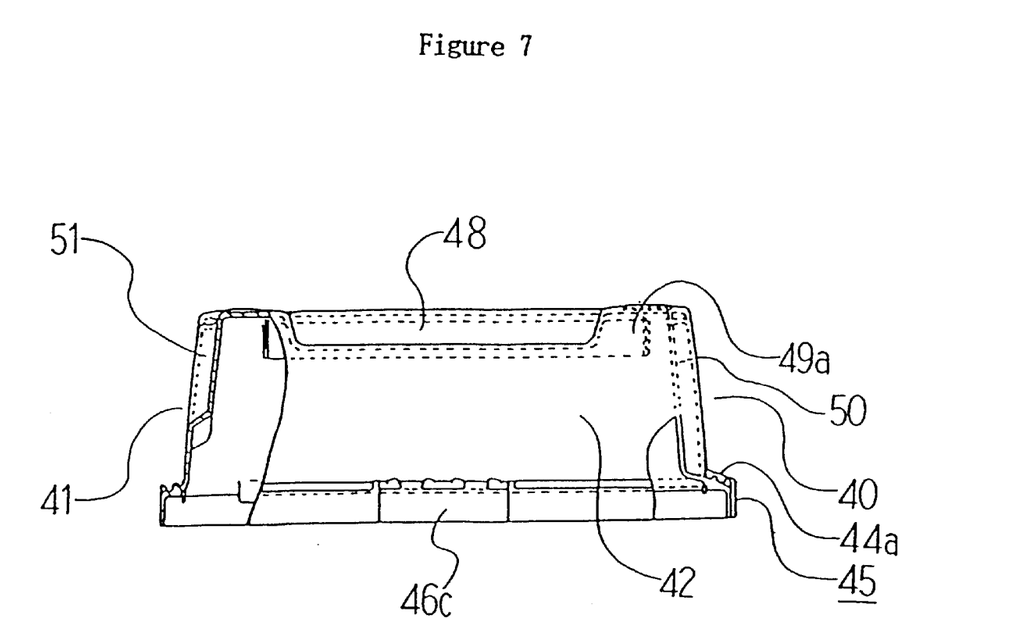
FIG. 7 is an elevated view partly in section of a lid.
Figure 8:
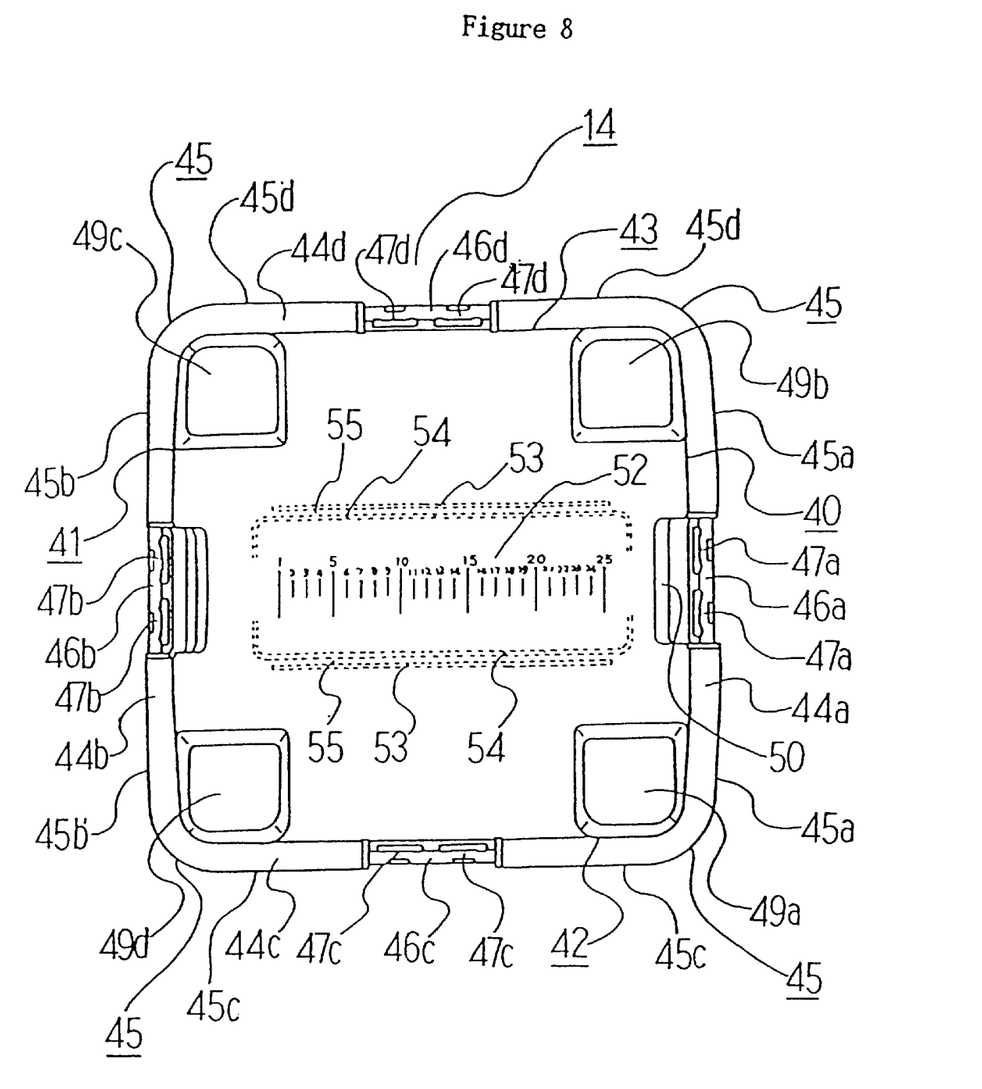
FIG. 8 is a top view of a lid.
Figure 9:
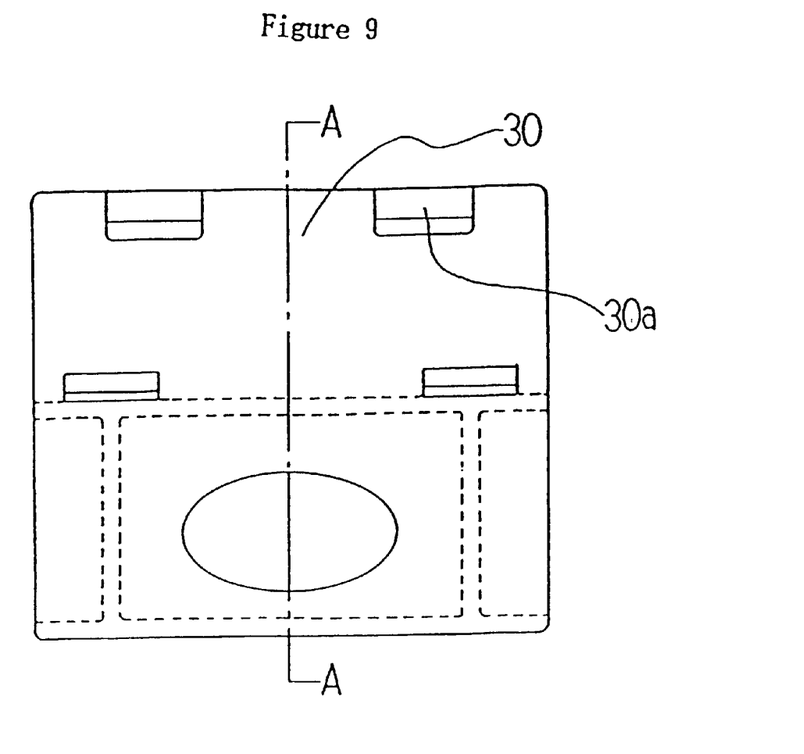
FIG. 9 is an elevated view of a clip.
Figure 10:
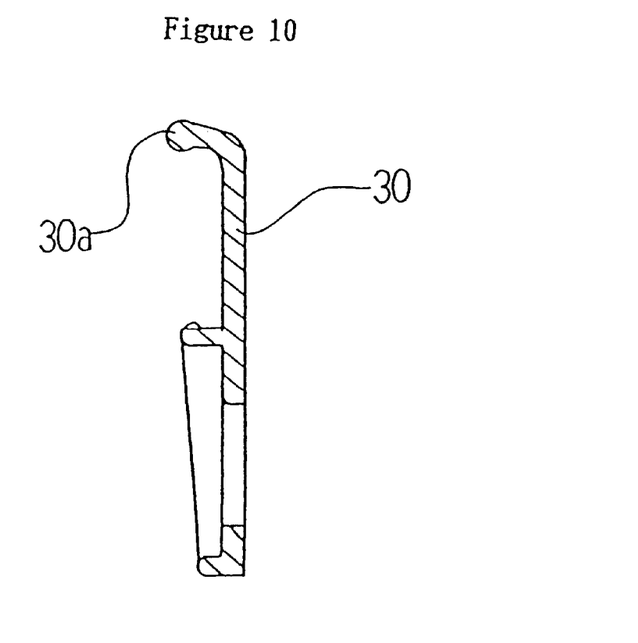
FIG. 10 is a sectional view of FIG. 9 along line A—A.

As shown in FIG. 7 and FIG. 8, the lid 14 includes sidewalls 40, 41, 42, 43, eaves 44a, 44b, 44c, 44d, and a sash 45. The eaves 44a, 44b, 44c and 44d horizontally protrude from the bottom end of sidewalls 40, 41, 42 and 43 to engage with the seal groove 25. In addition, the eaves 44a, 44b, 44c and 44d include a sash 45 which comprises plane surfaces 45a, 45b, 45c and 45d on the underside thereof. Each corner of the sash 45 is perpendicularly rounded. The sash 45 of lid 14 corresponds with the sash 20 of the case 12 to form one surface when the lid 14 covers the case 12.

As shown in FIGS. 1, 3, 7, 8, 9 and 10, clip recesses 46a, 46b, 46c and 46d are formed at the respective middle of plane surfaces 45a, 45b, 45c and 45d in order to engage with four clips 30. Each clip recess has an engaging hole 47a, 47b, 47c and 47d to engage with a top end protrusion 30a of the clips 30. The clips 30 are removably engaged with the lid 14.

As shown in FIGS. 3, 7 and 8, the lid 14 further includes a ceiling portion 48 having a curved center, and upwardly protruding corners 49a, 49b, 49c and 49d. The protruding corners 49a, 49b, 49c and 49d are respectively designed to engage the dents 29a, 29b, 29c and 29d of another case 12 to assist in the stacking of a plurality of containers 10.

The sidewalls 40 and 41 have reinforcing dents 50 and 51 respectively, to firmly maintain the shape of the lid 14 and to identify the front from the rear of the lid 14. The lid 14 is formed by a plastic injection molding of a transparent resin, e.g., a polycarbonate. The transparent lid 14 allows articles in the container 10 to easily be viewed. A scale 52 having numeric indicators is displayed on the upper side of the ceiling portion 48 to indicate the number and the positions of wafers inside the container 10.

The lid 14 has an engaging groove 55 formed by protruding lines 53 and 54 at the inner side of the ceiling portion 48. The engaging groove 55 is rectangularly shaped and approximately corresponds to a base plate 56 of the wafer support 11 allowing the wafer support 11 to be removed therefrom.

Figure 11:
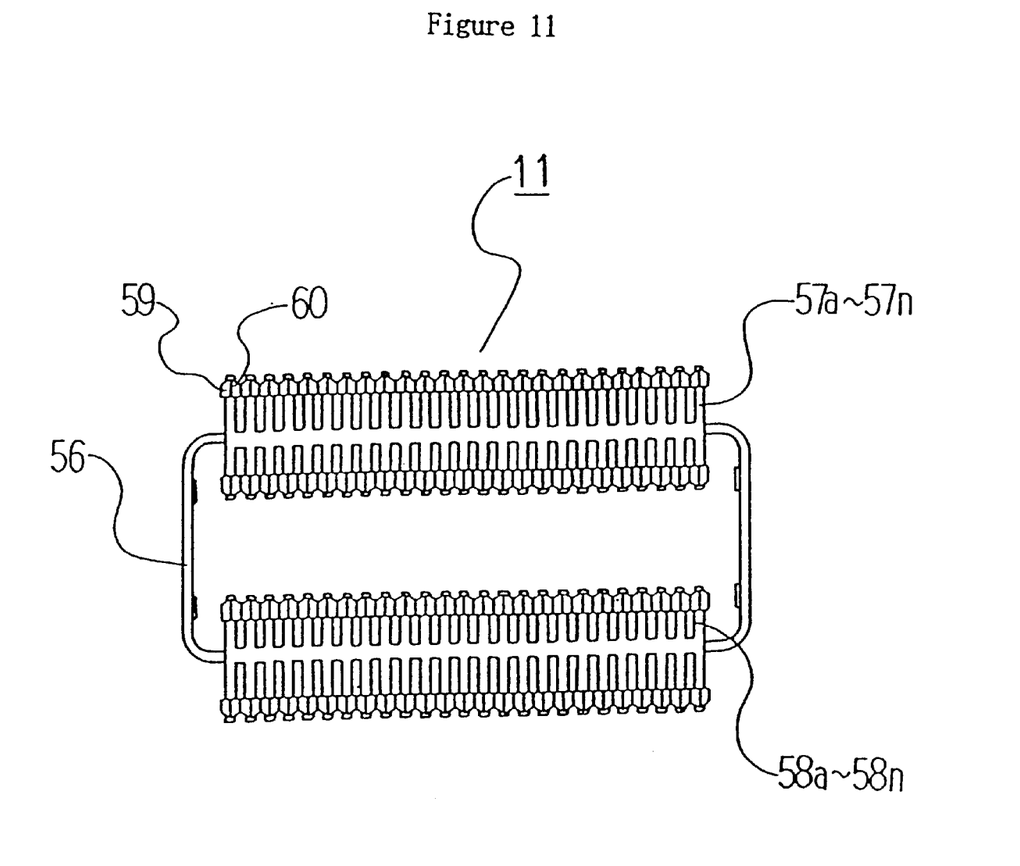
FIG. 11 is a top view of a wafer support.
Figure 12:
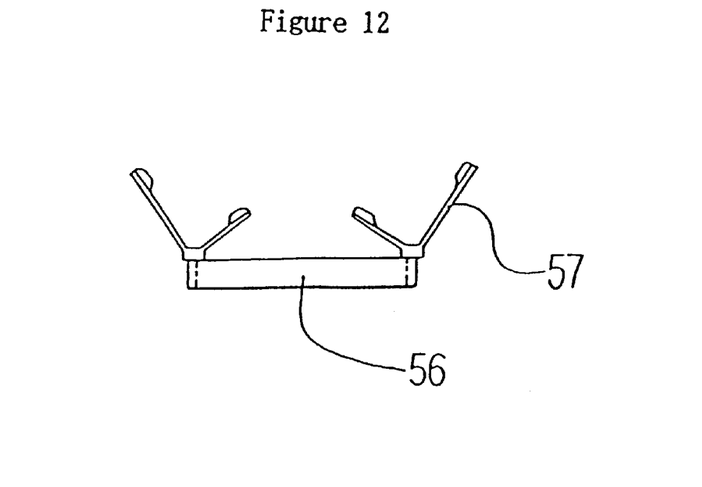
FIG. 12 is a side view of FIG. 11.
Figure 13:
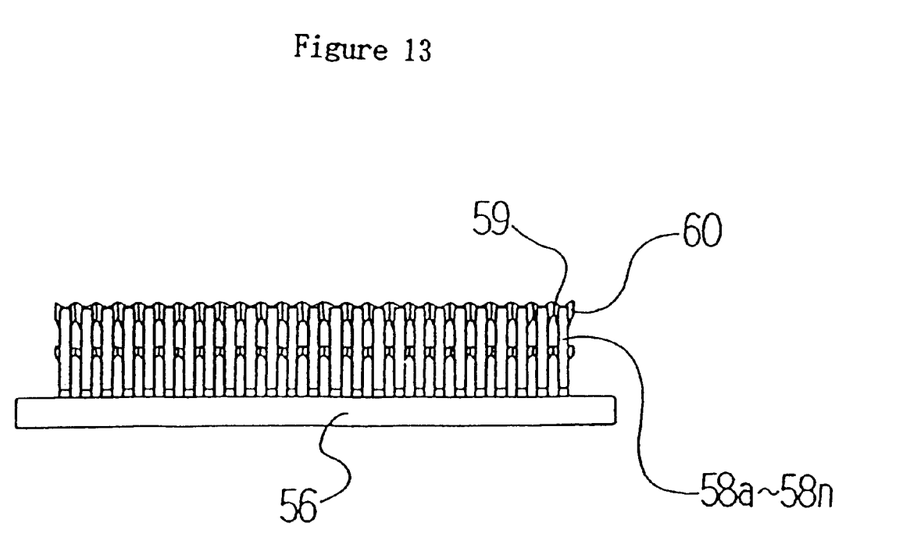
FIG. 13 is an elevated view of a wafer support.
Figure 14:
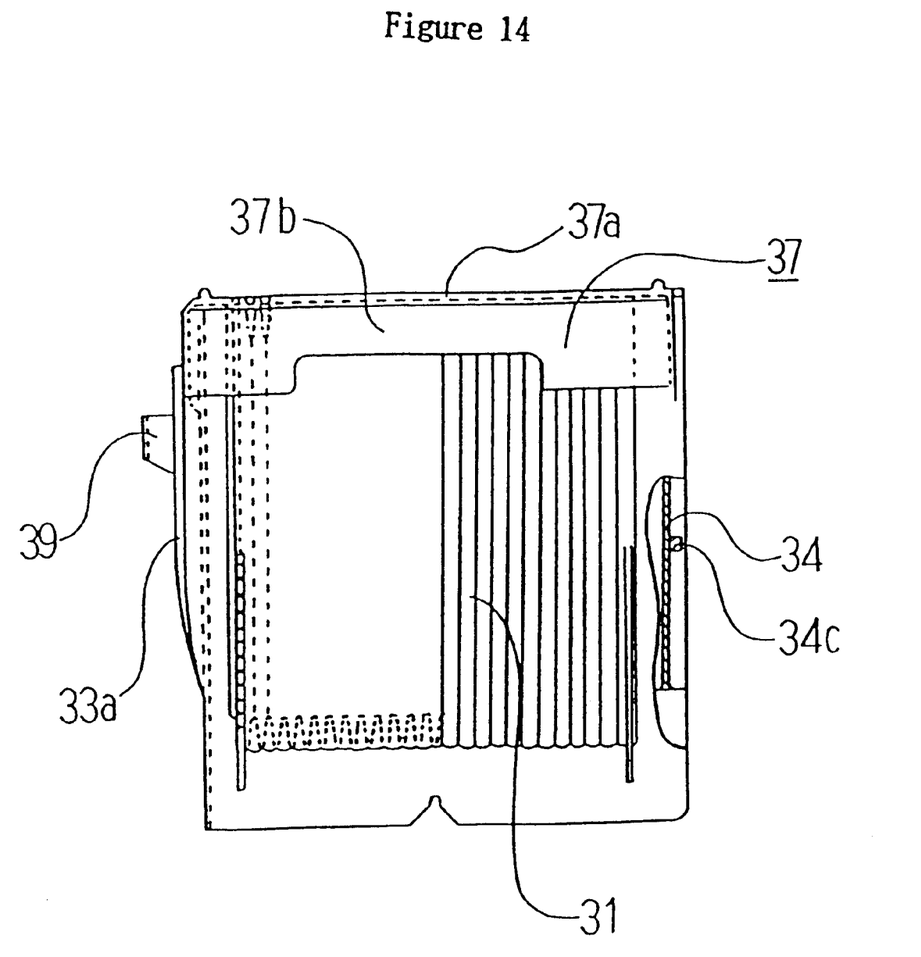
FIG. 14 is an elevated view partly in section of a wafer carrier.
Figure 15:
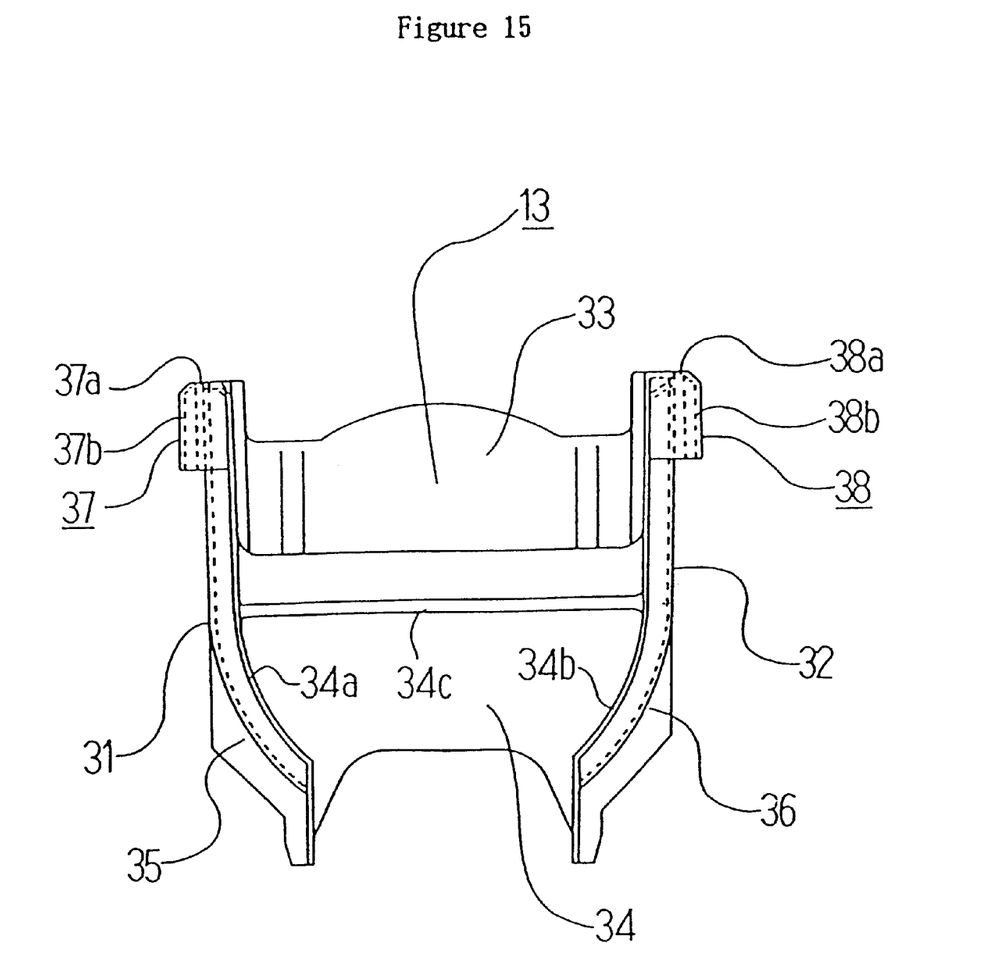
FIG. 15 is a side view of FIG. 14.
Figure 16:
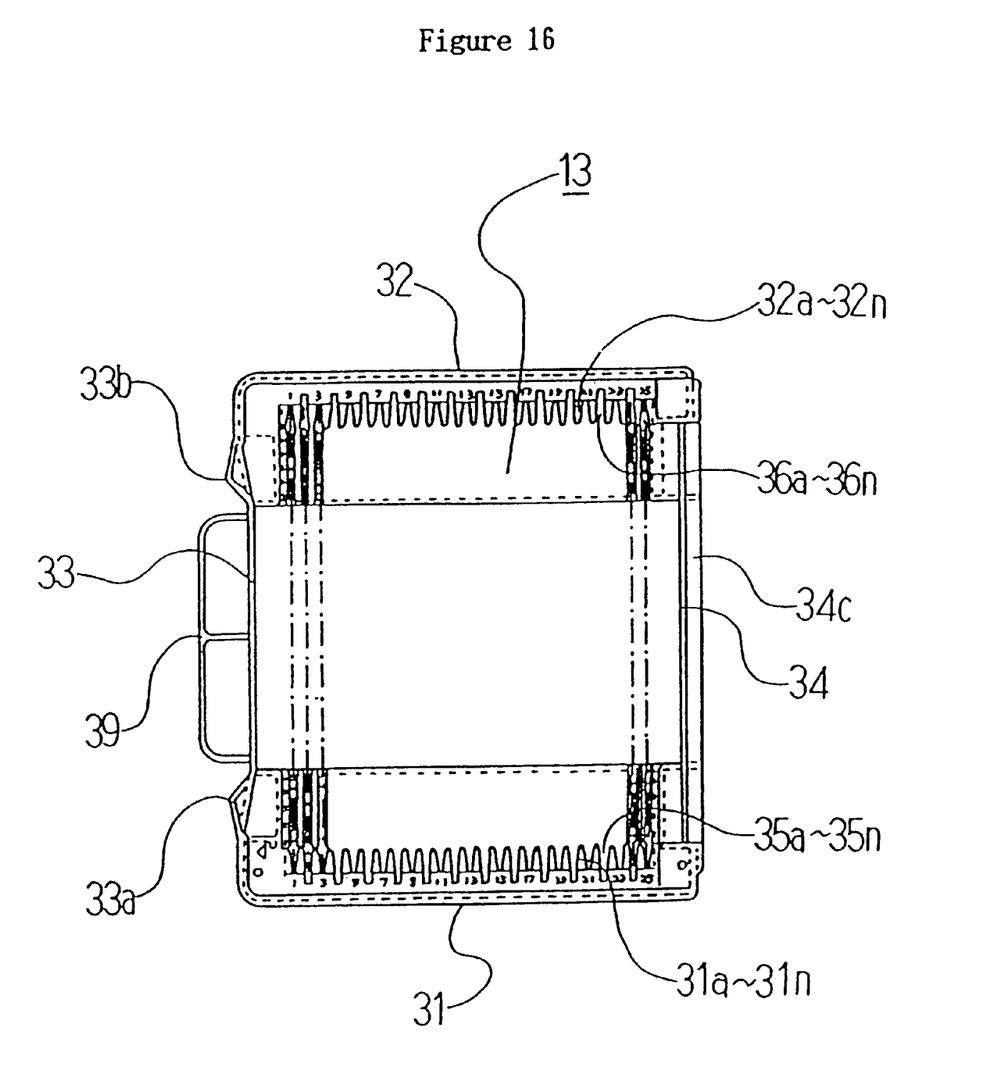
FIG. 16 is a top view of a wafer carrier.
Figure 17:
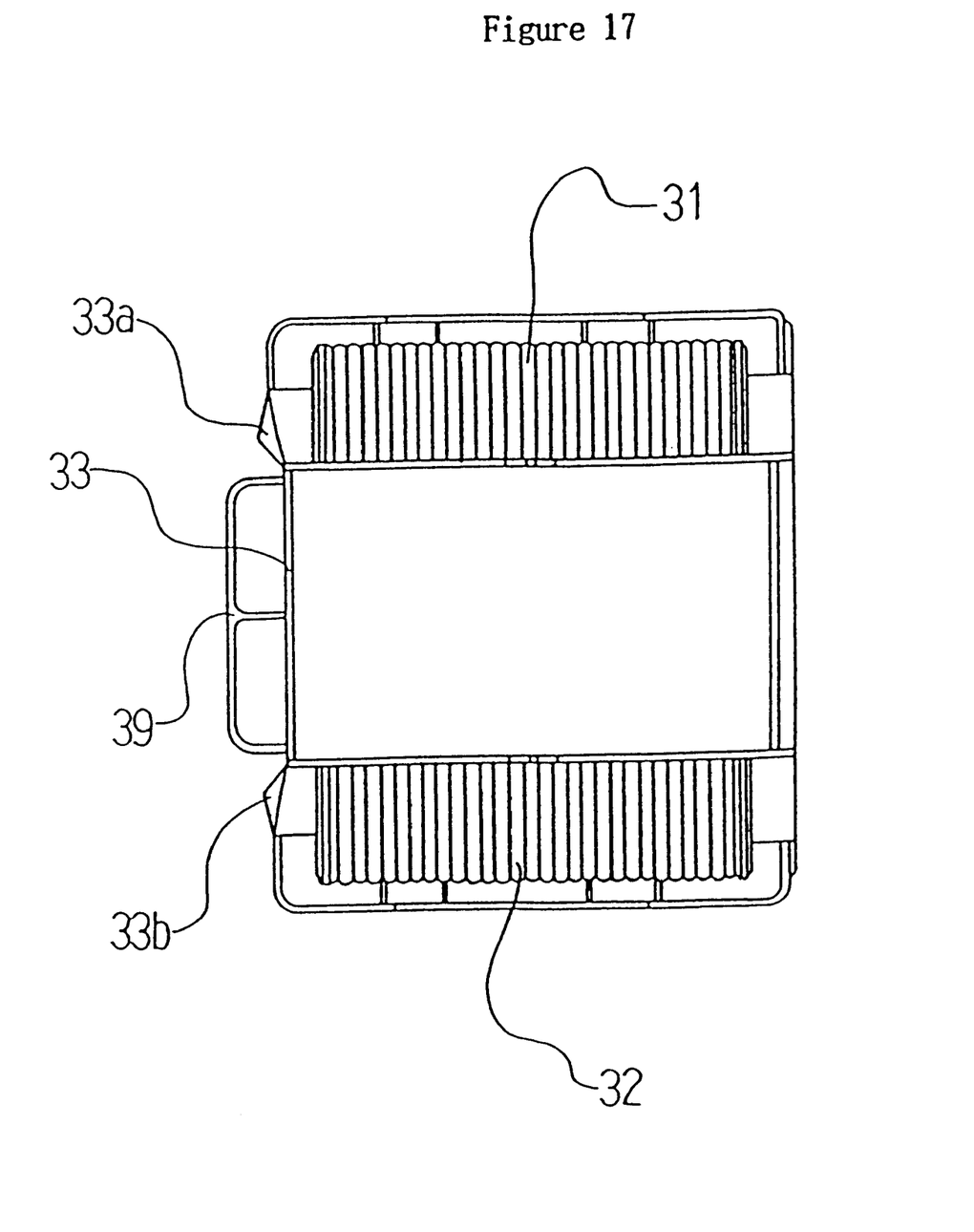
FIG. 17 is a bottom view of a wafer carrier.

As shown in FIGS. 11, 12 and 13, the wafer support 11 has a plurality of supporting spring rows 57a~57n and 58a~58n that pectinately protrude from both elongated sides of the base plate 56, similar to teeth in a comb. Each supporting spring row is resilient. The number of supporting spring rows are dependent on the number of wafer to be contained in the container 10. The supporting spring rows 57a~57n and 58a~58n are individually united and open downwardly at almost a perpendicular angle. The supporting spring rows 57a~57n and 58a~58n individually have spring teeth 59 and 60 at each end thereof. The spring teeth 59 and 60 are molded so as to open downward by approximately 90°. The spring teeth 59 and 60 contact with the edges of a wafer when a wafer is positioned in one of the supporting spring rows.

As shown in FIGS. 14, 15, 16 and 17, the wafer carrier 13 comprises side plates 31, 32, a front plate 33 and a rear plate 34 molded as a unit. The bottom of the wafer carrier 13 contains an opening. The side plates 31 and 32 are symmetrical and upright, and the lower portions of the side plates are curved inwardly to hold semiconductor wafers therein. The inner surfaces of the side plate 31 and 32 respectively have opposing series of spacing ribs 31a~31n and spacing ribs 32a~32n. Holding grooves 35a~35n and 36a~36n are formed between each of the spacing ribs 31a~31n and 32a~32n. Semiconductor wafers that are inserted into the holding grooves are axially spaced to prevent the wafers from contacting each another.

The spacing ribs 31a~31n and 32a~32n are vertically elongated and curved inwardly at the lower portions 35 and 36. The lower portions 35 and 36 approach each other but remain open at the bottom of the carrier 13. Accordingly, the disk-shaped semiconductor wafers are held by the lower portions 35 and 36. Additionally, the holding grooves 35a~35n and 36a~36n can be easily washed and dried because the top and the bottom of the wafer carrier 13 are open.

Flanges 37a and 38a are outwardly protruding from the top end of the side plates 31 and 32. The flanges 37a and 38a respectively include flange side panels 37b and 38b at the outside thereof. Handles 37 and 38 are formed on each of the side plates, flanges and flange side panels. The sidewalls of the wafer carrier 13 are strengthened by the handles. The wafer carrier 13 can be easily lifted by hands or robots when the handles 37 and 38 are held. A number scale is depicted on the upper surface of the flange 37a to indicate the number of wafers in the carrier.

Both sides of the front plate 33 outwardly protrude into protruding portions 33a and 33b. These portions 33a and 33b act to stiffen the wafer carrier 13. A handle 39 is molded in the center of the upper portion of the front plate 33 to assist in movement or transportation of the wafer carrier 13.

The rear plate 34 includes outwardly protruding stiffeners 34a and 34b along the outer surface of the side plates 31 and 32. A bar 34c connects the intermediate portion of the stiffeners 34a and 34b to strengthen and stiffen the wafer carrier 13. In addition, the outer surfaces of the side plates 31 and 32 are corrugated so as to strengthen and lighten the wafer carrier 13 and to prevent deformation or torsion of the wafer carrier 13 during molding.

Figure 18:
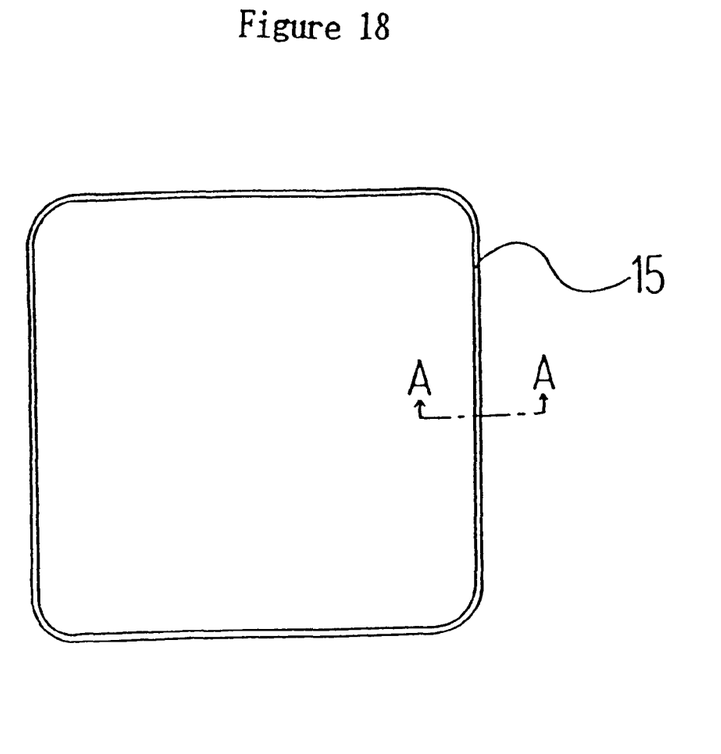
FIG. 18 is a top view of a gasket.

As shown in FIG. 18, a gasket 15 is shaped around the square shape of the case 12, and the gasket 15 follows the rounded corners of the case. The gasket 15 is inserted into the seal groove 25 of case 12 to provide an airtight seal when the case 12 is engaged with the lid 14. The gasket 15 is preferably composed of a resin having an extremely low volatility. For example, polyesterelastomers are preferable because of their mechanical and moldable characteristics.

Figure 19:
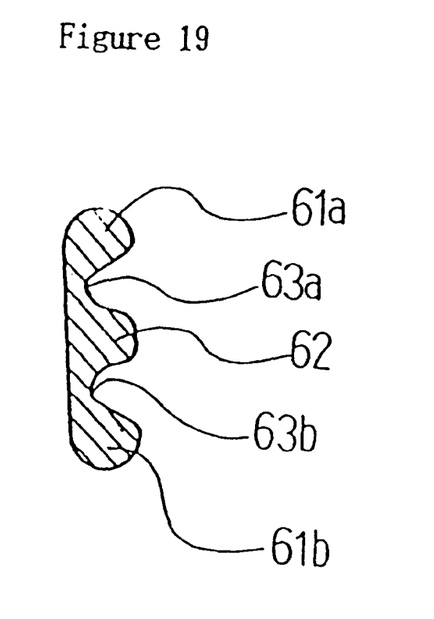
FIG. 19 is an enlarged sectional view of FIG. 18 along line A—A.

As shown in FIG. 19, a cross-section of the gasket is illustrated. The gasket 15 includes end protrusions 61a and 61b at the top end and the bottom end and center protrusion 62 at intermediate position. Accordingly, constricted portions 63a and 63b are formed between each protrusion. The center protrusion 62 is formed slightly smaller than the end protrusion. Each protrusion extends in the same direction.

In this embodiment, shown in FIG. 19, the right side of the gasket is positioned on the outer side of the case and the left side of the gasket is positioned on the inner side of the case 12. Therefore, each protrusion faces to the outer side of the case 12 when the gasket 15 is inserted into the seal groove 25. The constricted portions 63a and 63b are bent when the lid 14 is closed, and both end protrusions 63a and 63b are pressed into the center of the gasket. When the lid 14 is opened, the end protrusions 63a and 63b return back to their original shape due to their resiliency. The center protrusion 62 enhances this resiliency, allowing the case 12 to be secured tightly by the lid 14.

As described above, the container of the present invention has a seal groove on the open top of the case. A gasket is inserted into the seal groove to allow the case to have an airtight seal when engaged by the lid. Further, the lid is fitted on the case firmly by engagement of four clips into respective clip recesses. Each clip is designed to be removably attached to the lid. The number of clips may vary corresponding to the user's requirements and as such may improve the industrial usefulness of the container. Therefore, the container for packing semiconductor wafers provides superior airtightness that prevents contamination of the wafers by air.

In another embodiment, the parts of the container can be fabricated from materials having a low volatility to reduce contamination of the wafers by volatile materials. The lid can be composed of a polycarbonate material having a low volatility. The case, the wafer carrier and the wafer support can be composed of a polypropylene material also having a low volatility. The clips can be made of a polyamide material. The gasket can be made of a polyesterelastomeric material. The polymide and polyesterelastomeric materials should also have a low volatility. Accordingly, the container of the present invention has superior characteristics that prevent contamination of semiconductor wafers contained therein.

What is claimed is:

1. A gasket for use in sealing a container comprising:
    a substantially annular ring, said ring having rounded top and bottom end protrusions, said top and bottom end protrusions circumferentially extending about said substantially annular ring;
    a center protrusion interposed between said top and bottom end protrusions, said center protrusion circumferentially extending about said substantially annular ring;
    a first constricted portion positioned between said top end protrusion and said center protrusion; and
    a second constricted portion positioned between said center protrusion and said bottom end protrusion,
    wherein said center protrusion is smaller than said top and bottom end protrusions allowing said first and second constricted portions to bend and said top and bottom end protrusions to press said center protrusion when said gasket is compressed, wherein said first and second constricted portions have equal annular circumferences, wherein said gasket comprises first and second side surfaces, said top end, bottom end and center protrusions defining said first side surface of said gasket, wherein said second side surface has no protrusions, wherein a portion of the surface of said top end protrusion between a distal portion of said top end protrusion and said first constricted portion defines a first line, wherein a portion of the surface of said bottom end protrusion between a distal portion of said bottom end protrusion and said second constricted portion defines a second line, and wherein extensions of said first and said second lines intersect at a point opposite said second side surface.

2. A gasket as claimed in claim 1, wherein said first side surface further defines an outer side surface of said gasket.

3. A gasket, as claimed in claim 1, wherein said gasket is composed of a non-volatile material.

4. A container including a gasket for use in sealing a case and a lid, said gasket comprising:

a substantially annular ring having top and bottom end protrusions, said top and bottom end protrusions circumferentially extending about said substantially annular ring and said top and bottom end protrusions having a substantially rectangular shape; a center protrusion interposed between said top and bottom end protrusions and circumferentially extending about said substantially annular ring, said center protrusion being smaller than said top and bottom end protrusions;
    a first constricted portion positioned between said top end protrusion and said center protrusion; and
    a second constricted portion positioned between said center protrusion and said bottom end protrusion,
    wherein said gasket is insertable in a seal groove having a bottom surface defining a bottom plane in one of said case and said lid, whereby airtightness between said case and said lid is made by a resiliency of said first and second constricted portions, said resiliency allowing said first and second constricted portions to be bent and said top and bottom end protrusions to press toward said center protrusion when said gasket is compressed, and wherein said gasket is asymmetric about a line of force acting on said gasket when said lid is in a closed position, and wherein said line of force is perpendicular to said bottom plane of said bottom surface of said seal groove and an engaging surface of said lid.

5. A container, as claimed in claim 4, wherein the resiliency of said first and second constricted portions is promoted by said center protrusion.

6. A container, as claimed in claim 4, wherein said gasket comprises first and second side surfaces, said top end, bottom end and center protrusions defining said first side surface of said gasket.

7. A container, as claimed in claim 6, wherein said first side surface further defines an outer side surface of said gasket.

8. A container, as claimed in claim 4, wherein said gasket is composed of a non-volatile material.

9. A gasket having a cross section, said cross section comprising:
    top and bottom end protrusions;
    a center protrusion interposed between said top and bottom end protrusions, said center protrusion being smaller than said top and bottom end protrusions;
    a first constricted portion extending between said top end protrusion and said center protrusion;
    a second constricted portion extending between said center protrusion and said bottom end protrusion,
    wherein said first and second constricted portions are bent and said top and bottom end protrusions are pressed toward said center protrusion when said gasket is compressed, wherein said first and second constricted portions have equal annular circumferences, wherein said top end, said bottom end and said center protrusions define a first side surface of said gasket, and wherein said top and bottom end protrusions and said center protrusion each have a base defined by a line intersecting said first and second constricted portions at said first side surface, wherein said base of each of said first and second end protrusions and of said center protrusion has a length, and wherein said lengths are approximately equal.

10. A gasket, as claimed in claim 9, wherein said gasket is composed of a non-volatile material.

* * * * *